United States Patent [19]
Yokoi et al.

[11] Patent Number: 5,962,970
[45] Date of Patent: Oct. 5, 1999

[54] ORGANIC ELECTROLUMINESCENT DISPLAY PANEL INCLUDING BONDING PADS ARRANGED AT A PERIPHERY OF AN IMAGE REGION

[75] Inventors: Akira Yokoi; Satoshi Miyaguchi; Kenichi Nagayama; Hirofumi Kubota; Kenji Yoshida; Taizo Ishida, all of Tsurugashima, Japan

[73] Assignee: Pioneer Electronic Corporation, Tokyo, Japan

[21] Appl. No.: 08/725,610

[22] Filed: Oct. 3, 1996

[30] Foreign Application Priority Data

Oct. 6, 1995 [JP] Japan .................................. 7-260220

[51] Int. Cl.$^6$ ...................................................... M01J 1/62
[52] U.S. Cl. ........................... 313/506; 313/505; 313/509; 313/512
[58] Field of Search ..................................... 313/504, 505, 313/506, 507, 508, 509, 511, 512

[56] References Cited

FOREIGN PATENT DOCUMENTS

| | | |
|---|---|---|
| 0550062 A2 | 7/1993 | European Pat. Off. . |
| 0553496 A2 | 8/1993 | European Pat. Off. . |
| 0639937 A2 | 2/1995 | European Pat. Off. . |
| 0732868 A1 | 9/1996 | European Pat. Off. . |

OTHER PUBLICATIONS

Patent Abstracts of Japan, vol. 097, No. 001, Jan. 31, 1997 & JP 08 227276 A (Pioneer Electron Corp.), Sep. 3, 1996.

SID International Symposium Digest of Papers, May 1992, vol. 23, Society For Information Display, pp. 543–546, XP000479084 Uchiike H. et al., "Reflective Phosphor Deposition On The Barrier Electrode Structure Of An AC Plasma Display Results In High Brightness and High Luminous Efficiency".

IEEE Electron Device Letters, vol. 15, No. 3, Mar. 1, 1994, pp. 97–99, XP000439164 Stevens R. et al., "Enhancing The Brightness of Thin–Film Electroluminescent Displays By Improving The Emission Process".

*Primary Examiner*—Vip Patel
*Attorney, Agent, or Firm*—Perman & Green, LLP

[57] ABSTRACT

A method for manufacturing an organic EL display panel includes; forming first display electrodes corresponding to emitting portions and bonding pads arranged at a periphery of an image-region as a patterning step; forming electrically insulative ramparts for exposing at least portions of the first display electrodes and protruding from the substrate as a rampart formation step, the each electrically insulative rampart having an overhanging portion projecting in a direction parallel to the substrate preferably at an upper and further having extensions each extending between the adjacent bonding pads to isolate the adjacent bonding pads each other and define a bonding-region between the adjacent extensions on each the bonding pad; depositing organic electroluminescent media onto exposed portions of the first display electrodes respectively, thereby forming organic function layers each including at least one organic electroluminescent medium on the first display electrodes; and forming second display electrodes on the organic function layers and the bonding-regions of the bonding pads so as to electrically connect to the bonding pads.

4 Claims, 7 Drawing Sheets

FIG.1

EMISSION

ORGANIC ELECTROLUMINESCENT DISPLAY PANEL INCLUDING BONDING PADS ARRANGED AT A PERIPHERY OF AN IMAGE REGION

BACKGROUND OF THE INVENTION

1. Field of the Invention

The present invention relates to an organic electroluminescent display panel or device comprising in matrix a plurality of organic electroluminescent elements (also referred to herein as EL elements) each including an emitting layer made of an organic compound material, which utilizes an electroluminescence phenomenon that is the emission of light resulting from injection of an electric current to the emitting layer.

2. Description of the Related Art

Generally, an organic EL element comprises one or more organic function layers made of EL media disposed between a cathode and an anode. In micro-patterning steps for forming the cathode and the organic function layers, there is a difficulty due to low levels in durabilities of heat resistance (e.g., 100 centigrade degree or less), wet-proof and solvent-resisting characteristic. In case that the ordinary photolithography patterning is utilized for the formation of such function layers of the organic EL element, the solvent in the photoresist may infiltrate into the function layers of the EL element. Such an organic EL element suffers from a high temperature atmosphere during pre-baking of the photoresist. The development solution or etching liquid for the photoresist layer may also intrude into the organic EL element. These procedures probably damage the EL element. Even plasma in the dry-etching for the photoresist layer damages the organic function layers of the EL element. These damages cause the deterioration in performance of the organic EL element and the emission property thereof. This is a serious problem.

Alternatively, there is a vacuum deposit patterning process for forming the cathode in the organic EL element by using a shadow mask to be put on the substrate on which the anode and the organic function layers are previously formed. In this case, there are also many problems. That is, the leakage of the vapor of cathode material occurs between the mask and the substrate due to an incomplete contact thereof. Otherwise, the shadow mask is compulsorily, sealingly put into contact with the substrate or the organic function layers. In this case, the organic function layer is physically damaged due to the contact of the forced mask during the deposition, so that resultant cathode comes into contact with the anode to be short-circuited. In addition, the mask is apt to be warped because of insufficient strength of the mask having a great number of openings for such stripe patterns in an large area as stripe cathode patterns. It is therefore very difficult to form precise fine patterns for the cathode of the organic EL element. There have been known EL display devices as shown in Japanese Patent Kokai Nos. 2-66873, 5-275172, 5-258859 and 5-258860, the latter of three corresponding to U.S. patent applications Ser. Nos. 814512, 814163 and 814553 respectively. The disclosed full color EL display device comprises a plurality of emitting pixels existing at intersections of columns and rows of matrix electrodes.

The pixels in the EL device are formed on a common transparent substrate with electrical insulation. The line electrodes made of transparent material are formed on the substrate and spaced from one another. This first transparent electrodes connect the adjacent pixels. Organic EL media are formed on the first electrodes and the substrate. The pixels include the second electrodes of row formed on the organic EL media respectively and spaced from one another. The second electrodes of row extends perpendicular to the first electrodes and connect the adjacent pixels respectively. In the emitting device, there is employed a simple matrix structure that the first and second electrodes sandwich the organic EL media at the intersections thereof.

In the patterning technology disclosed in Japanese Patent Kokai Nos. 5-275172, 5-258859 and 5-258860, such an emitting device is manufactured as follows: Straight higher walls with a height of several or tens micrometers as standing masks are previously formed on the substrate. Then the second electrodes and the organic EL medium thin films are vacuum-deposited in such a manner that such higher wall masks selectively and selectively shield a boundary from a vapor flow of the predetermined organic EL medium which is provided onto the surface of the substrate in only one slanting direction to the substrate.

Such a patterning process has still a difficulty to form such standing wall masks having a high aspect ratio (height/bottom) in its cross-section on the substrate when fine pixels and patterns are fabricated for the full-color display panel. Even if such higher wall masks are formed on the substrate for a fine pattern, the strength of walls will be low and thus the reliability in the performances and shapes of the resultant second electrodes and organic EL media films will be low. For example, there is a probability of collapse of such wall masks during a wire-bonding of a conductive material from outside, so that the organic function layers and the first and the second electrodes are short-circuited.

SUMMARY OF THE INVENTION

Therefore, the present invention has been made to solve such a problem in view of the forgoing status. An object of the invention is to provide an organic electroluminescent display panel with durability and method for manufacturing the same which are capable of being manufactured without deterioration of the organic function layer, cathode and other elements. In accordance with a first aspect of the present invention, an organic EL display panel including an image-region having a plurality of emitting portions comprises;

- a substrate on which a plurality of first display electrodes corresponding to emitting portions and a plurality of bonding pads arranged at a periphery of an image-region are formed;
- electrical insulative ramparts projecting from the substrate for exposing at least portions of the first display electrodes respectively;
- organic function layers each including at least one organic electroluminescent medium formed on exposed portions of the first display electrodes;
- second display electrodes formed on the organic function layers;
- electrical insulative ramparts each having an overhanging portion projecting in a direction parallel to the substrate preferably at an upper;
- said ramparts further having extensions each extending between said adjacent bonding pads to isolate said adjacent bonding pads each other and define a bonding-region between the adjacent extensions on each said bonding pad to be electrically connected to said second display electrode; and
- said bonding pads having an external bonding-region to be electrically connected to said bonding-region and a conductive material. In the forgoing organic EL display panel, said first and the second display electrodes are formed as stripes respectively, and each first display electrode is arranged perpendicular to each second display electrode.

In accordance with a second aspect of the present invention, a method for manufacturing an organic EL display panel including an image-region having a plurality of emitting portions comprises the steps of;

forming a plurality of first display electrodes corresponding to emitting portions and a plurality of bonding pads arranged at a periphery of an image-region as a patterning step;

forming, on the substrate, electrically insulative ramparts for exposing at least portions of the first display electrodes and protruding from the substrate as a rampart formation step, said each electrically insulative rampart having an overhanging portion projecting in a direction parallel to the substrate preferably at an upper and further having extensions each extending between said adjacent bonding pads to isolate said adjacent bonding pads each other and define a bonding-region between the adjacent extensions on each said bonding pad;

depositing organic electroluminescent media onto exposed portions of the first display electrodes respectively, thereby forming a plurality of organic function layers each including at least one organic electroluminescent medium on the first display electrodes; and forming a plurality of second display electrodes on the organic function layers and said bonding-regions of said bonding pads so as to electrically connect to said bonding pads.

In this method for manufacturing an organic EL display panel, said rampart formation step further comprises preferably the steps of;

forming entirely a rampart material layer on said substrate;

forming a photo mask with a predetermined pattern openings on the rampart material layer;

etching the rampart material layer through the openings of the photo mask by using a dry-etching or wet-etching, thereby forming the ramparts having said overhanging portions.

In this way, since the rampart protects the organic function layer during the formation thereof, there is decrease of damage of the organic function layer due to the shadow mask put thereon, even if there is performed a direct contact onto the rampart of the mask with insufficient strength and precise fine patterns such as stripe patterns. In addition, the use of the rampart and the shadow mask makes a sure separation of RGB organic function layers and shares the coatings of RGB organic media at a high precision. According to the invention, it is possible to form a pixel pattern with a delta arrangement RGB in the display panel and also draw a bent or meandered cathode pattern on the display panel, even though the conventional method restricts such a flexible layout of pattern of pixels only within a stripe shape pattern. This is because the wall masks must be formed perpendicular to the only one slanting direction of the organic EL medium vapor flow.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings which are incorporated in and constitute a part of this invention and, together with the description, serve to explain the principles of the invention in general terms. Like numerals refer to like parts throughout the disclosure.

The above set forth and other features of the invention are made more apparent in the ensuing Detailed Description of the Invention when read in conjunction with the attached Drawings.

DETAILED DESCRIPTION OF THE PREFERRED EMBODIMENTS

The embodiments according to the present invention will be described in more detail with reference to the accompanying drawings.

Figure 1:
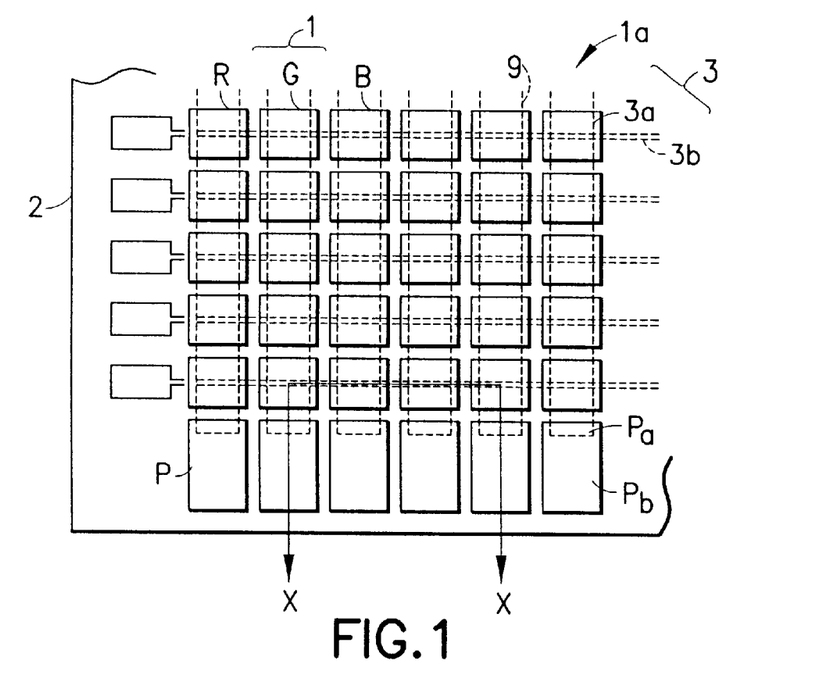
FIG. 1 is a partially enlarged simplified plan view of an organic EL display panel according to the present invention.

FIG. 1 shows a partially enlarged simplified front plan view of an organic EL display panel of an embodiment which is provided with a plurality of emitting pixels 1 arranged in a matrix as an image-region 1a. This is seen through a transparent substrate 2 of the panel from the outside thereof. Each pixel has one or more emitting portions for i.e., red (R), green (G) and blue (B) lights in order to display an image. Moreover, a plurality of bonding pads P separated each other are formed at a periphery of the image-region image-region 1a on the substrate 2.

The image-region image-region 1a of the substrate 2 on the backface is provided with a plurality of first display electrodes or lines 3 of rows arranged parallel to one another as stripes in a coplanar surface thereof. Each first display electrode 3 comprises a plurality of island-wise transparent electrodes 3a made of a high work-function material such as indium tin oxide (referred to herein as "ITO") and bus-line 3b electrically connecting these island-wise transparent electrodes. The bus-line is made of an electrical conductive material with a low resistance such as Al, Mg, Cu, Au and an alloy including at least one thereof and the like. Each emitting portion is defined by the intersections of the first display electrode line 3 and a second display electrode line 9 which will be described later.

Figure 2:
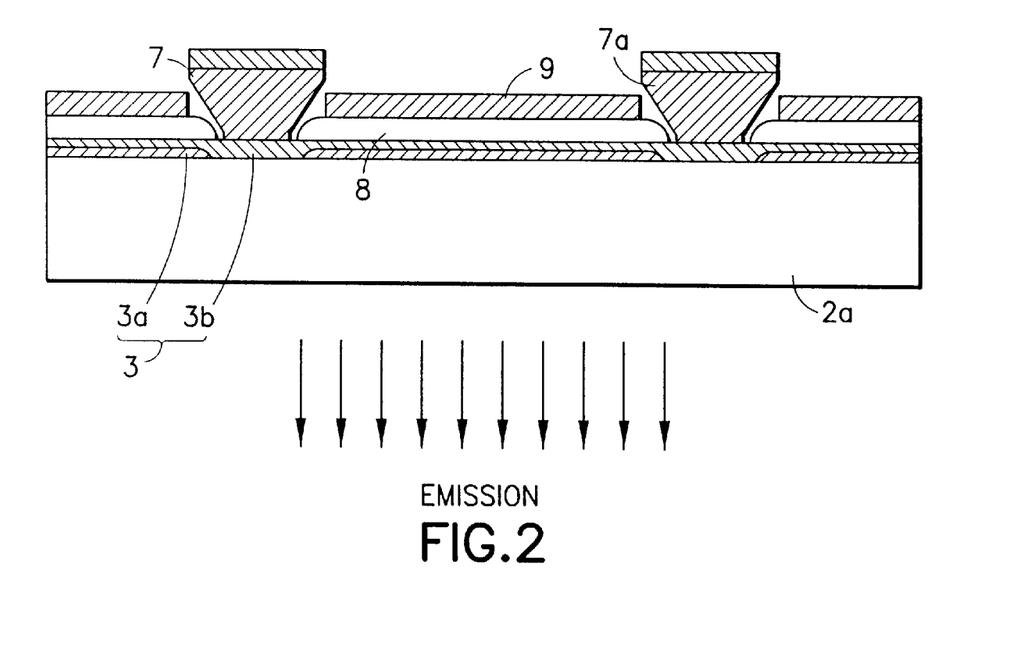
FIG. 2 is an enlarged cross-section view of an organic EL display panel taken off along a line X—X of FIG. 1 according to the present invention.

With reference to FIG. 2 illustrating an enlarged cross-section view taken off along a line XX of FIG. 1, a plurality of ramparts 7 made of an electrically insulative material are formed on the backface of the substrate 2 so as to be arranged perpendicular to the first display electrode lines 3 spaced from each other. The electrical insulative ramparts 7 project from or stand on the substrate 2 so as to expose at least surface portions, particularly island-wise transparent electrodes 3a of the first display electrodes 3 respectively in the step for deposing themselves which will be described later.

Each electrical insulative rampart 7 has overhanging portions 7a projecting in a direction parallel to the substrate at an upper thereof. The overhanging portion 7a is longitudinally formed along the upper edge of the rampart 7. That is, the rampart 7 has or an inverse-tapered or a T-shaped cross-section in the lateral.

Between the ramparts 7, organic function layers 8 including at least one organic electroluminescent medium or compound are formed and arranged over the exposed portions of the first display electrodes 3 so as to cover entirely them. The organic function layer 8 includes three organic EL media thin films e.g., an organic hole transport layer, an organic emitting layer and an organic electron transport layer as a three-layer structure. The organic function layer 8 may alternatively include a two-layer structure comprising an organic hole transport layer and an organic emitting layer.

A second display electrodes 9 are formed on the organic function layers 8 respectively so as to be perpendicular to the first display electrodes 3 apart from one another. The second display electrode line 9 is made of a low work-function material such as Al, Mg, Li and an alloy including at least one thereof and the like as long as associated with the organic electroluminescent medium of the function layers 8. In this way, the intersections of the first and second display electrode lines 3 and 9 sandwiching the organic function layers 8 correspond to light emitting portions respectively in the organic EL display panel of the matrix type. In this organic EL display panel of the embodiment, the substrate 2 and the island-wise transparent electrodes 3a of the first display electrodes 3 are light transmissible, and thus the light emission radiates from the substrate 2. In contrast, the second display electrode may be made of a transparent material so as to emit light through the second display electrode in another embodiment of an organic EL display panel.

Figure 3:
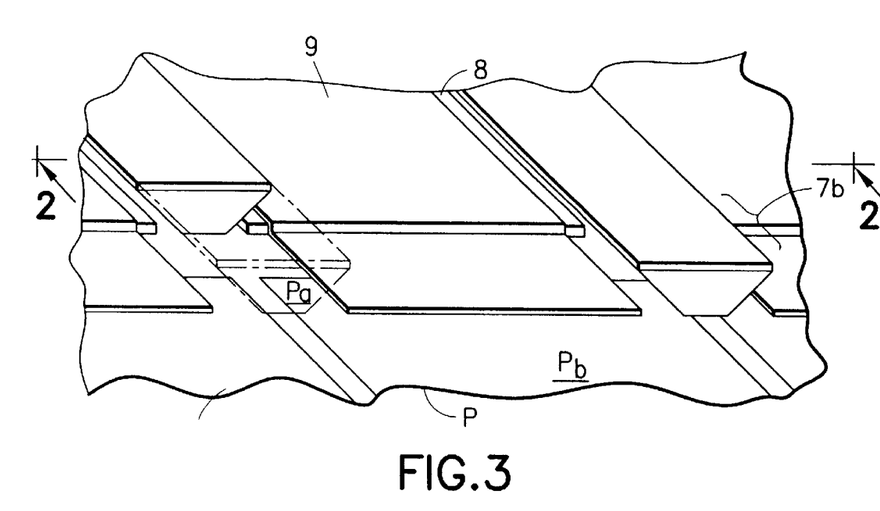
FIG. 3 is a partially enlarged perspective view of an organic EL display panel according to the present invention which is broken partially.

With reference to FIG. 3 illustrating an enlarged perspective view substantially corresponding to FIG. 2 but broken partially, each rampart 7 has an extension 7b which extends between the adjacent two bonding pads P. The adjacent two extensions 7b also define a bonding-region Pa therebetween on the bonding pad P to be electrically connected to the second display electrode 9. The extension 7b electrically isolates the particular adjacent pads P each other.

Furthermore, each bonding pad P includes an external bonding-region Pb extending from the bonding-region Pa to be electrically connected by a wire-bonding or a press-bonding with an anisotropic conductive material to an external line or device e.g., an EL driving circuit.

According to the invention, the overhanging portions 7a of the ramparts 7 function as eaves so that the edge portions of organic function layers 8 take shelter from the rain-wise vapor flow. This is useful to avoid a short-circuit between the first and second display electrode lines 3 and 9 as well as the organic function layers 8. Furthermore, the extension 7b may function as eaves similarly to avoid a short-circuit between the adjacent bonding pads P and may reduce the collapse of the rampart during the bonding operation. In addition, the organic EL display panel may be formed as a monochrome display panel comprising single or two color emitting portions instead of RGB emitting portions in the organic function layers 8 of this embodiment. Moreover, the island-wise transparent electrodes 3a and the bus-line 3b may be integrated as a single stripe electrode.

A process for manufacturing the organic EL display panel is now described in detail.
(First display electrode line formation)

Figure 4:
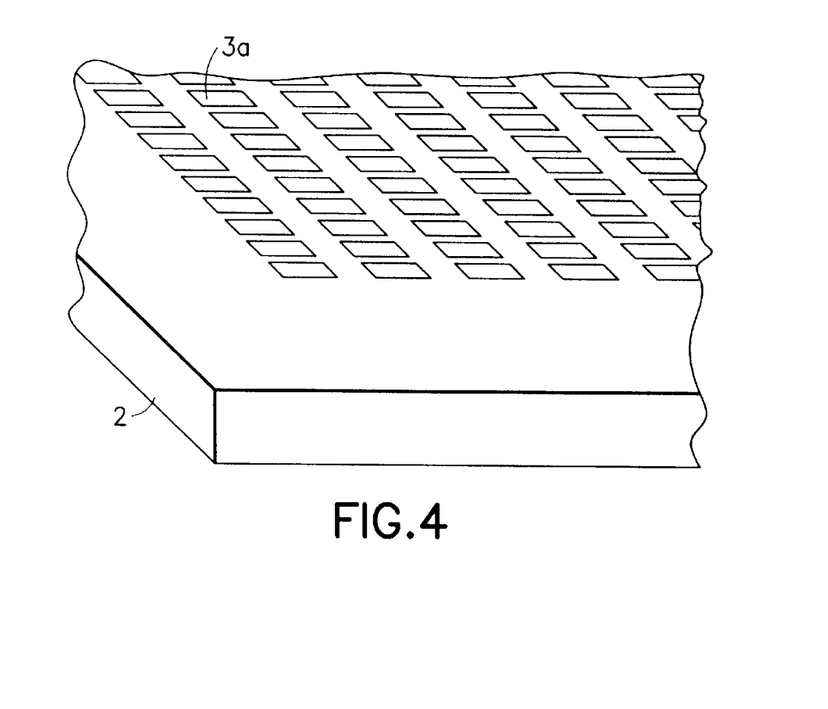
FIG. 4 is a perspective view showing a substrate in a process for manufacturing an organic EL display panel according to the present invention.
Figure 5:
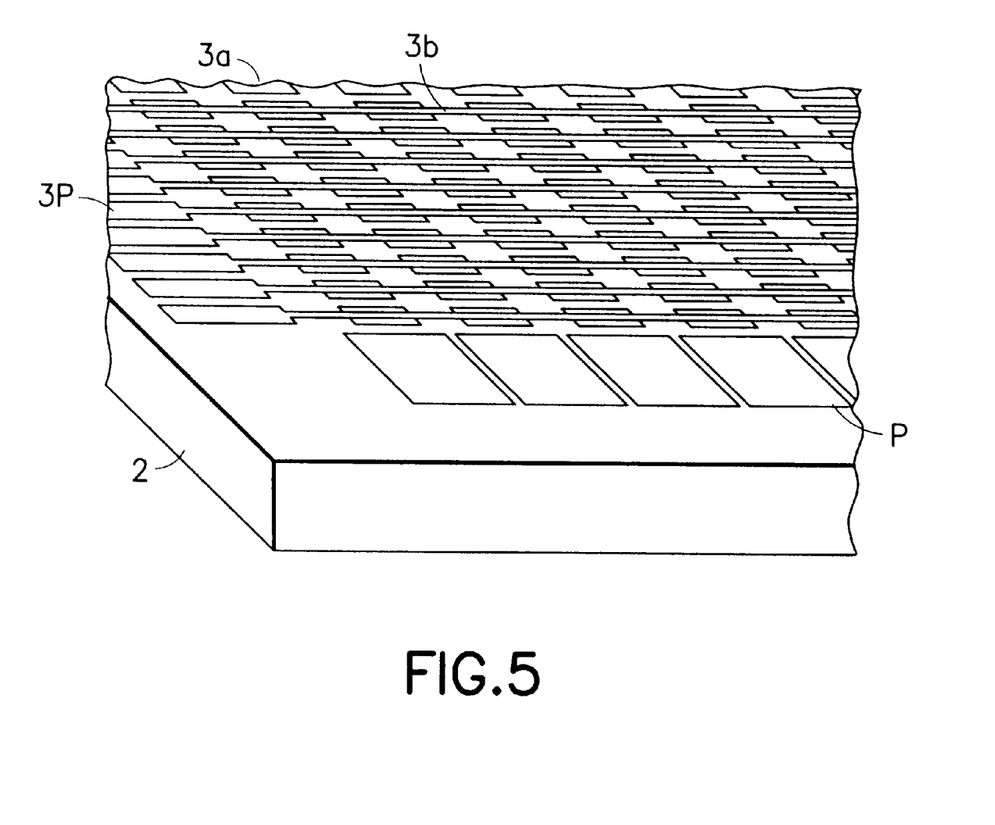
FIG. 5 is a perspective view showing a substrate in a process for manufacturing an organic EL display panel according to the present invention.

As shown in FIG. 4, a plurality of island-wise transparent electrodes 3a of a high work function material such as ITO are formed in a matrix on a transparent substrate 2 of glass. Subsequently, as shown in FIG. 5, bus-lines 3b with bonding pads 3P are formed on the island-wise transparent electrodes 3a and the transparent substrate 2, so that bus-lines cross over the island-wise transparent electrodes to be overlap and electrically connected to each other by using a vacuum vapor deposition. The width of the bus-line 3 is less than that of the island-wise transparent electrode. The first display electrode line 3 has, for example, 0.3 mm pitch, 0.28 mm width and 0.2 micrometers thickness. In this way, a plurality of first display electrodes 3 of a stripe shape of made the transparent conductive material are formed parallel to each other on the substrate 2. In addition, excepting the island-wise transparent electrodes 3a, 3P and the bonding pads P, the first display electrode lines may be covered with an electrical insulative layer.
(Rampart formation)

Figure 6:
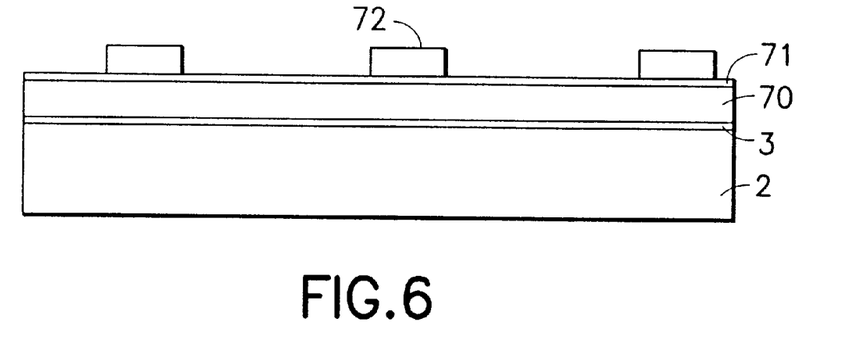
FIG. 6 is an enlarged cross-section view showing a substrate in a process for manufacturing an organic EL display panel according to the present invention.

As shown in FIG. 6, by using a spin-coating method in the rampart formation step, the first display electrodes 3 on the substrate 2 are entirely covered with a rampart material such as non-photosensitive polyimide 70 as a rampart layer up to a 3 micrometers thickness. Then second rampart material such as $SiO_2$ 71 for the overhanging portion is entirely formed on the rampart layer of polyimide 70 by using a sputtering method up to a 0.5 micrometers thickness.

Next, the $SiO_2$ layer 71 is spin-coated with a photoresist as a mask layer up to one micrometer thickness, and then the mask 72 of photoresist each having a 20 micrometers width is formed by using an ordinary photolithography, so that the photoresist pattern for ramparts is formed.

Figure 7:
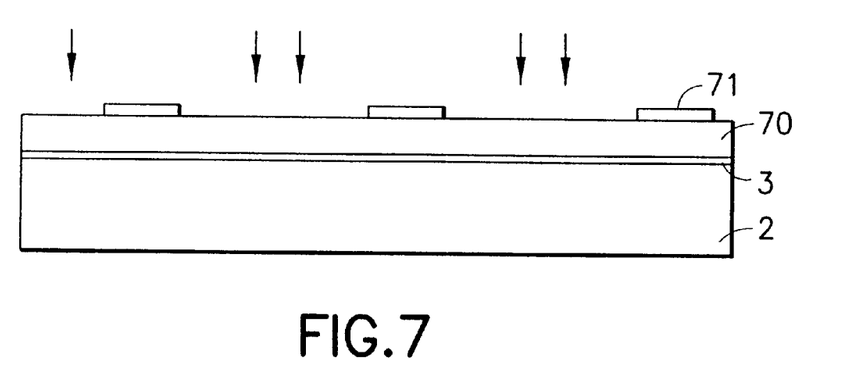
FIG. 7 is an enlarged cross-section view showing a substrate in a process for manufacturing an organic EL display panel according to the present invention.

Subsequently, as shown in FIG. 7, the $SiO_2$ layer 71 is selectively etched via openings of the mask 72 by a reactive-ion etching method so as to be the same photoresist pattern of ramparts.

Figure 8:
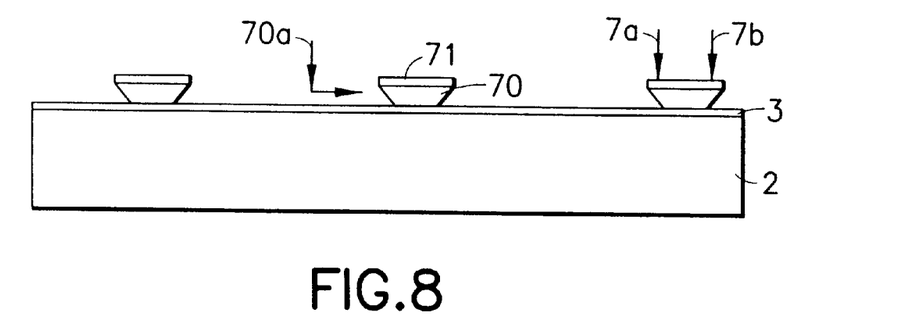
FIG. 8 is an enlarged cross-section view showing a substrate in a process for manufacturing an organic EL display panel according to the present invention.

After that, a two step etching is performed as follows: First, the polyimide layer 70 is dry-etched by an $O_2$ gas perpendicular to the substrate without any undercut (anisotropic etching). Next, the polyimide layer 70 is wet-etched by an alkali solution for approximately 30 seconds or one or two minutes so that the wall side 70a of the rampart body of polyimide 70 is isotropically etched as shown in FIG. 8. As a result, there is formed the rampart 7 consists of the body of polyimide and the overhanging portion 7a of $SiO_2$ with a T-shaped or inverse-tapered (inverse-isosceles trapezoid) cross-section as a whole. In this way, there is obtained the insulative rampart having an overhanging portion projecting in a direction parallel to the substrate preferably at the upper.

Figure 9:
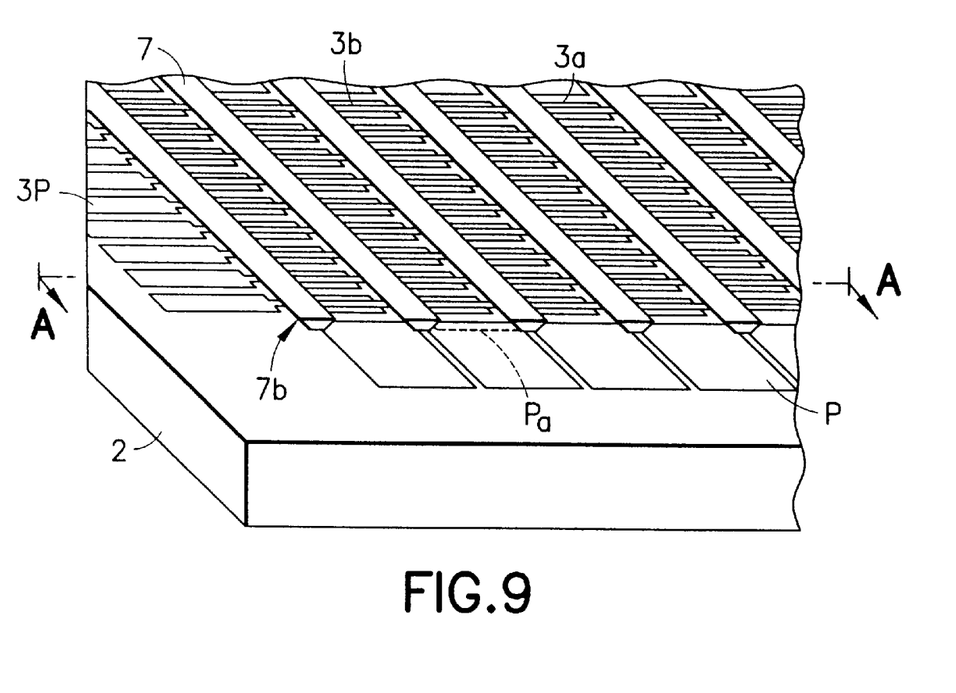
FIG. 9 is a perspective view showing a substrate in a process for manufacturing an organic EL display panel according to the present invention.

As shown in FIG. 9, The ramparts 7 are formed by using a pattern that each extension 7b of ramparts extending between the adjacent bonding pads P to isolate the adjacent bonding pads P each other and define the bonding-region Pa between the adjacent extensions 7b on each bonding pad P. The second display electrodes in the later step are electrically connected to the defined bonding-region Pa.

The so-called polyimides stated above includes a precursor which is a previous substance before imidization such as aromatic. Such a precursor is heated up to approximately 300 centigrade degree after casted, so that imidization is complete to cause a thermally stable polyimide. The casted aromatic precursor may be used as it is as far as it becomes integrity without any inconvenience. Alternatively, instead of polyimide and $SiO_2$, pertinent materials disintegrated during the first or second-stage etching may be used for the rampart body of the upper and the overhanging portion of the lower respectively. The electric insulative materials having shape strength of the rampart even before the formation of the organic function layer also may be used for them.

The height of the T-shaped cross-section rampart 7 from the substrate is not restricted as far as it does not provide any electric short-circuit between the individual ITO anode 3 and the individual second display electrode or cathode 9 which will be formed in the later process. Concretely, the height of the rampart 7 preferably ranges from one micrometer to 10 micrometers. In addition, the width of the overhanging portion 7a protruding from the body side of the T-shaped rampart 7 is sufficiently one micrometer or more, and the thickness of the overhanging portion is sufficiently 0.2 micrometer or more as far as they do not provide any electric short-circuit of the electrodes similarly.

(Organic function layer formation)

Figure 10:
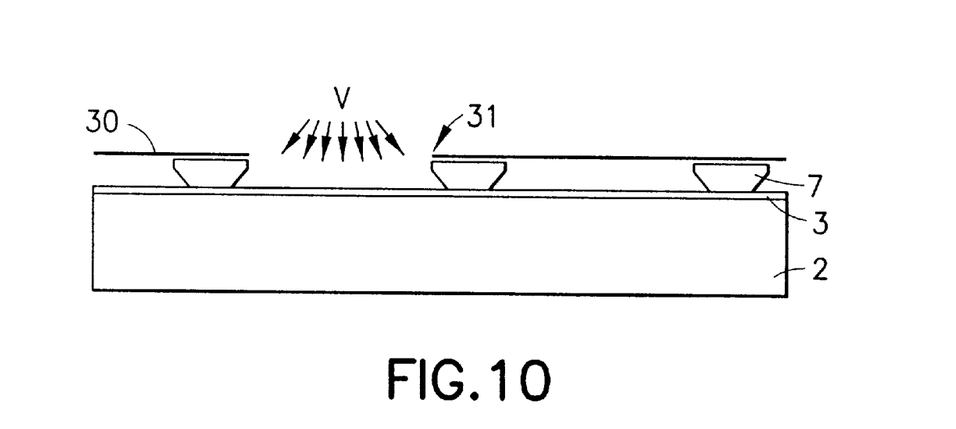
FIG. 10 is an enlarged cross-section view showing a substrate taken off along a line A—A in FIG. 9.

FIG. 10 shows in detail the organic function layer formation step. While openings 31 of the shadow mask 30 are aligned to portions of the substrate 2 each surrounded by the rampart 7 and the shadow mask is put and fixed onto top surfaces of the ramparts. After that, first organic function layers for a first color emission (e.g., red) are vacuum-deposited at a predetermined thickness through the openings onto the first display electrodes 3 between the ramparts. The substrate is preferably placed during the vacuum-deposition in such a manner that the vapor "V" of the organic EL medium goes around the overhanging portion and reaches portions beneath the overhanging portion. For example, the substrate is rotated on its axis or another external axis under the vapor flow. Alternatively, the substrate is placed under a plurality of vapor sources. There is not restriction of angle of the substrate surface to the vapor flow "V" of the media. It should be noted that the metal vapor flow in the later step is substantially vertical to the surface of the substrate so that the overhanging portion 7a prevents the deposition of the metal thereunder on the edges of the organic function layer thereby to avoid a short circuit with the first electrode.

In this way, the first color organic function layers are formed on the first display electrodes respectively. In addition, in case that the organic function layer of the three-layer structure (e.g., an organic hole transport layer, an organic emitting layer and an organic electron transport layer) is formed, the corresponding different organic media may be vacuum-deposited in this step. In the later each step for the function layer, this multi-deposition may be performed similarly.

Next, the shadow mask is shifted toward the left by one rampart so that the openings are aligned to the adjacent rampart spaces, and then the mask is fixed onto top surfaces of the ramparts. Subsequently, second organic function layers for a second color emission (e.g., green) are vacuum-deposited at a predetermined thickness onto the first display electrodes 3. After that, the formation for a third organic function layers of a third color emission (e.g., blue) is similarly performed. In this way, it is preferable that the mask putting and aligning step and the media depositing step are repeated in such a manner of that the shadow mask is shifted to an adjacent portion where the openings aligned to adjacent other first display electrodes.

Figure 11:
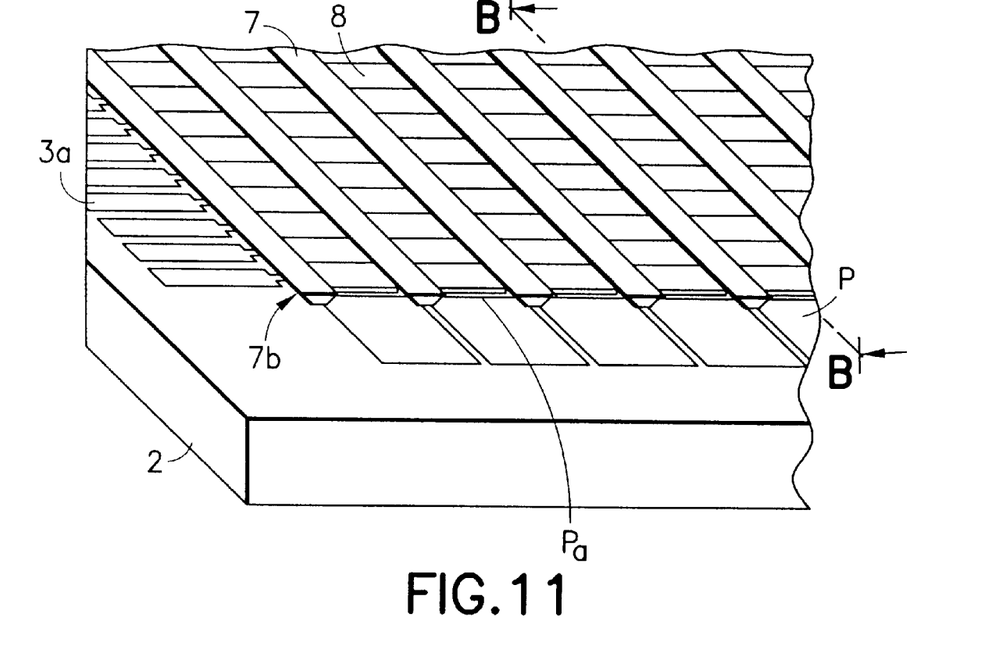
FIG. 11 is a perspective view showing a substrate in a process for manufacturing an organic EL display panel according to the present invention.

After the formations for RGB EL media layers, the shadow mask is removed, the substrate 2 is obtained on which the organic function layers 8 is arraigned on and perpendicular to the first display electrode lines 3 between the ramparts 7 as shown in FIG. 11.

(Second display electrode formation)

Figure 12:
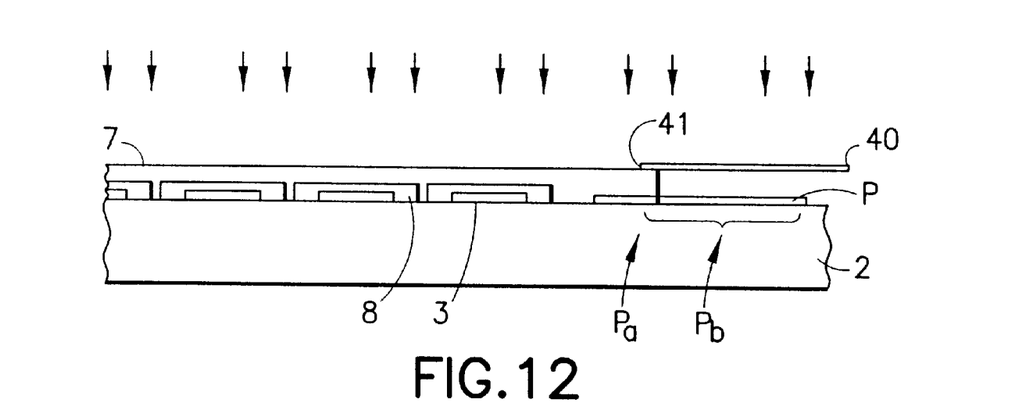
FIG. 12 is an enlarged cross-section view showing a substrate taken off along a line B—B in FIG. 11 perpendicular to the first display electrode lines.
Figure 13:
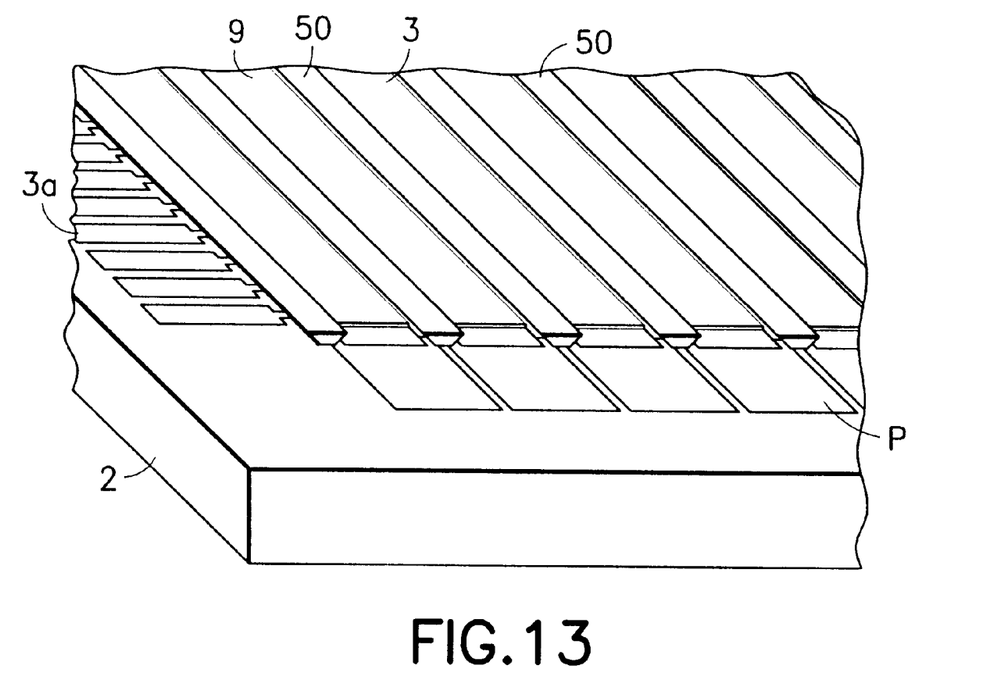
FIG. 13 is a perspective view showing a substrate in a process for manufacturing an organic EL display panel according to the present invention.

As shown in FIG. 12, while a electrode-formation mask for 40 with an opening 41 is aligned in such a manner that the opening 41 expose both the image-region 1a including the organic function layers 8 and the ramparts 7, and the bonding-region Pa of the bonding pads defined by the pairs of adjacent extensions 7b, then the mask is placed on the ramparts. After that, a low resistance metal such as Al, Mg, Au and the like and an alloy thereof is vacuum-deposited as cathodes 9 with a predetermined thickness on the resulting RGB organic function layers 8 in such a manner that the metal vapor drops perpendicular to the substrate without step coverage. The mask 40 covers the bonding pads P except the bonding-region Pa surrounding the image-region 1a during the second display electrode formation. The covered portion of the bonding pads P by the mask 40 becomes an external bonding-region Pb extending from the bonding-region Pa to be electrically connected to an external device. Since the external bonding-region Pb projects and expands away from the extension 7, the extensions 7b are destroyed even when being electrically connected by a wire-bonding or a press-bonding with an anisotropic conductive material to an external line or device. In the step for forming the second display electrode at a predetermined thickness, the top of the rampart 7 and the overhanging portion 7a serves as a roof and eaves against the metal vapor, so that, as shown in FIG. 13, the metal film 50 deposited on the top of the rampart 7 and the overhanging portion 7a is electrically and spatially separated second display electrode 9 to avoid the short-circuit between the second display electrode lines 9 as well as the organic function layers 8.

In other words, it is noted that the metal vapor flow is substantially vertical to the surface of the substrate so that the overhanging portion 7a of the rampart prevents the deposition of the metal thereunder on the edges of the organic function layer. The overhanging portion 7a of the rampart divides the metal layer deposited by the vertical metal vapor flow to the substrate, so that the cathode 9 is formed physically electrically apart from the metal layer deposited on the top face of the rampart. Therefore, the adjacent cathodes 9 sandwiching the rampart are electrically disconnected to each other. Moreover, the combination of the vertical metal vapor flow and the overhanging portion also causes the electrical insulation between the cathode 9 and the ITO anode 3 to prevent a short circuit therebetween, since the metal vapor flow going around the overhanging portion 7a does not reach so far as the edge of the organic function layer 8 of the organic EL medium previously formed so that the organic function layer 8 appears from the cathode 9. Thickness of the metal cathode is not restricted as far as it does not provide any short circuit.

After the formation of the second display electrode on the bonding-regions and the organic function layers, the sealing against moisture is performed, and then an organic EL full-color display panel is obtained. According to the present invention, there is provided an organic electroluminescent display panel with durability and method for manufacturing the same which are capable of being manufactured without deterioration of the organic function layer, cathode and other elements.

What is claimed is:

1. An organic electroluminescent display panel including an image-region having a plurality of emitting portions comprising:

a substrate on which a plurality of first display electrodes corresponding to emitting portions and a plurality of bonding pads arranged at a periphery of an image-region are formed;

electrical insulative ramparts projecting from the substrate for exposing at least portions of the first display electrodes respectively;

organic function layers each including at least one organic electroluminescent medium formed on exposed portions of the first display electrodes;

second display electrodes formed on the organic function layers;

said insulative ramparts each having an overhanging portion projecting in a direction parallel to the substrate;

said ramparts further having extensions each extending between said adjacent bonding pads to isolate said adjacent bonding pads each other and define a bonding-region between the adjacent extensions on each said bonding pad to be electrically connected to said second display electrode; and said bonding pads having an external bonding-region to be electrically connected to said bonding-region and a conductive material.

2. An organic electroluminescent display panel as set forth in claim 1, wherein said first and second display electrodes are formed as stripes respectively, and each first display electrode is arranged perpendicular to each second display electrode.

3. An organic electroluminescent display panel as set forth in claim 1, wherein said substrate and said first display electrode are transparent.

4. An organic electroluminescent display panel as set forth in claim 1, wherein said second display electrode is transparent.

* * * * *